April 27, 1965 A. J. JUDEINSTEIN 3,181,137

ANALOG TO DIGITAL CONVERTER

Filed Feb. 20, 1962 8 Sheets-Sheet 1

Inventor
ANDRE JACQUES JUDEINSTEIN

By [signature]
Attorney

April 27, 1965 A. J. JUDEINSTEIN 3,181,137

ANALOG TO DIGITAL CONVERTER

Filed Feb. 20, 1962 8 Sheets-Sheet 2

Inventor
ANDRE JACQUES JUDEINSTEIN

By [signature]
Attorney

Inventor
ANDRE JACQUES JUDEINSTEIN
By [signature]
Attorney

Inventor
ANDRE JACQUES JUDEINSTEIN
By Percy P. Lantzy
Attorney

Inventor
ANDRE JACQUES JUDEINSTEIN
By [signature]
Attorney

Inventor
ANDRE JACQUES JUDEINSTEIN
By [signature]
Attorney

April 27, 1965 A. J. JUDEINSTEIN 3,181,137

ANALOG TO DIGITAL CONVERTER

Filed Feb. 20, 1962 8 Sheets-Sheet 7

Inventor
ANDRE JACQUES JUDEINSTEIN

By Percy P. Lantzy
Attorney

April 27, 1965 A. J. JUDEINSTEIN 3,181,137

ANALOG TO DIGITAL CONVERTER

Filed Feb. 20, 1962 8 Sheets-Sheet 8

Inventor
ANDRE JACQUES JUDEINSTEIN
By Percy P. Lantzy
Attorney

United States Patent Office 3,181,137
Patented Apr. 27, 1965

3,181,137
ANALOG TO DIGITAL CONVERTER

André Jacques Judeinstein, Paris, France, assignor to International Standard Electric Corporation, New York, N.Y., a corporation of Delaware Filed Feb. 20, 1962, Ser. No. 174,473
Claims priority, application France, Feb. 21, 1961, 853,365
18 Claims. (Cl. 340—347)

This present invention relates to analog to digital converters, and more particularly to analog to digital converters utilizing phase locked sub-harmonic parametric oscillators as logical decision elements capable of very high speed conversions.

An analog to digital converter is a device that receives at its input a magnitude expressed in an analog form, for example a voltage, and delivers to its output numeric information characterizing the analog magnitude. Generally the numeric information is expressed in a binary code and in the course of the following description the output information will be expressed in the natural binary code. It is to be understood that this is to be considered as a non-limiting example.

It is known that two processes exist to carry out such conversions. The first process called "time modulation encoding" consists of comparing the signal to be coded to a sawtooth voltage, the triggering of the sawtooth being synchronized with the triggering of a pulse generator. The pulse generator feeds a counter arranged to count in the desired numerical code. The counter is blocked when the amplitudes of the signal to be coded and that of the sawtooth voltage are equal. The maximum amplitude which may be reached by the sawtooth is equal to the maximum possible amplitude of the signal to be coded and is represented by the highest number which the counter may store. Under these conditions, the number stored in said counter at the time of the amplitude coincidence of the sawtooth and the signal to be coded represents the numerical expression of the signal to be coded.

The second process called "feedback coding" consists of determining one by one in a time succession, beginning with the more significant figure, the different digits which constitute the code group representing the magnitude of the analog representation. In what will follow "digit of rank 1" will designate the most significant digit, "digit of rank 2" will designate the digit immediately less significant etc. . . . in a number or code group comprising 1, 2, . . . . . $m$, $(m+1)$, – – – – – – $n$ digits.

In one of the known processes of feedback encoding the weighting property particular to the binary natural code is used directly, namely, the weight of a digit of rank $n$ is double the weight of the digit of rank $(n+1)$. Thus, in a four digit code, the weight of the digit of rank 1 is $2^3=8$ units, the weight of the digit of rank 2 is $2^2=4$ units etc. . . . and the maximum magnitude of an analog representation which can be expressed is $2^4-1=15$ units.

By examining such a four digit code, it is seen that the digit of rank 1, $D_1$, is 1 for the magnitude of an analog representation in the range between $2^3=8$ units and $$2^4-1=15$$

units. Thus, if C designates the voltage of the signal to be coded and $R_1$ a reference voltage having a value $2^3=8$ units, the following is obtained:

$$D_1=1 \text{ when } C-R_1\geq 0$$
$$D_1=0 \text{ when } C-R_1<0$$

In the first case, the signal which remains to be coded has an amplitude $C-R_1$, whereas in the second case, it has an amplitude C, since the digit of rank 1 is 0.

The signal $C_1$ which remains to be coded after deriving the value of the digit of rank 1 is thus $C_1=C-D_1R_1$ from which the digit of rank 2, $D_2$, having a weight $2^2=4$ units will be determined. To obtain the value of the digit of rank 2, it is necessary that the reference voltage have a value of 4 units, namely $$\frac{R_1}{2}$$

The following is then obtained:

$$D_2=\underline{1} \text{ when } C_1-\frac{R_1}{2}\geq 0$$

$$D_2=\underline{0} \text{ when } C_1-\frac{R_1}{2}<0$$

and for a digit of rank $n$:

$$C_{n-1}=C_{n-2}-D_{n-1}\times\frac{R_1}{2^{n-2}}$$

$$D_n=\underline{1} \text{ when } C_{n-1}-\frac{R_1}{2^{n-1}}\geq 0$$

$$D_n=\underline{0} \text{ when } C_n-1-\frac{R_1}{2^{n-1}}<0$$

It goes without saying that instead of dividing $R_1$ by $2^{n-1}$, $R_1$ may be kept constant and the signal to be coded may be multiplied by two, which gives:

$$D_n=\underline{1} \text{ when } 2C_{n-1}-R_1\geq 0$$
$$D_n=\underline{0} \text{ when } 2C_{n-1}-R_1<0$$

In the known states of the art, feedback converters are able to obtain relatively high coding speeds which may reach a few hundred thousands of conversions per second by using amplifiers and logical circuits of classical structure.

An object of the present invention is to provide analog to digital converters of extremely high coding speed employing phase locking subharmonic parametric oscillators for the logical decision elements.

A feature of the analog to digital converter of the present invention is the provision of a signal generator to provide a reference signal, a pump signal, and the reference signal modulated by the analog signal to be coded, the resultant modulated reference signal having a predetermined phase relative to the reference signal and a first means responsive to the reference signal and the modulated reference signal to produce a locking signal having the phase of the larger amplitude one of the reference signal and the modulated reference signal. The locking signal is coupled to a sub-harmonic phase locked parametric oscillator to lock the oscillations initiated therein by the pump signal and a bias signal to the phase of the locking signal. The phase locked oscillations are extracted from the parametric oscillator to provide one digit of a code group representing the instantaneous amplitude of the analog signal whose value is dependent on the phase of the locked oscillations. The extracted oscillations, the reference signal, and the modulated reference signal are operated upon by a second means to provide an output signal proportional to the remainder of the analog signal to be coded after determination of the one digit.

Another feature of the present invention is a tandem arrangement of a plurality of coder stages each including the above described first means, parametric oscillator and second means to produce the digits of a code group representing the instantaneous amplitude of the analog signal.

Still another feature of the present invention is a feedback circuit coupling the output signal of the above-described second means to the input of the above-described first means a predetermined number of times and in a prescribed manner to generate the digits of a code group representing the instantaneous amplitude of the analog signal in a single coded stage.

The above mentioned and other features and objects of the present invention will become more apparent by reference to the following description taken in conjunction with the accompanying drawings, wherein.

Before describing in detail the operation of the device according to the present invention, the principle of the operation of the phase locked sub-harmonic parametric oscillator, referred to hereinafter in the following description and in the claims as a "parametric oscillator" or "phase locked parametric oscillator," will be described. The principle has been explained in numerous articles of the technical literature and in particular in the article "Parametric Phase Locked Oscillator" of L. S. Onyshkevych, W. F. Kosonocky, and A. W. Lo, published in the September 1959 issue of the "IRE Transactions on Electronic Computers."

When a parametric oscillator comprising a tank circuit includes elements made up either totally or partially by a nonlinear reactance suitably biased to determine the operating point, its operation may be summed up as follows:

(1) It oscillates on one of two phases disposed 180° from each other, the choice being determined by the noise present in the circuit when simultaneously:

The pump signal is present.

The nonlinear reactance is suitably biased.

(2) In order to change the phase of a parametric oscillator during oscillation, it is necessary to apply to it a high amplitude locking signal.

(3) In order to reduce to a minimum the build-up time of the oscillation having the desired phase, the locking signal may be applied before the beginning of the oscillation. Under these conditions the amplitude of the locking signal may be low although higher than the noise level. This method of operation is that used in the circuits according to the present invention. The parametric oscillator is set into oscillation by applying either the pump signal or the bias permanently to the parametric oscillator to prim the circuit for oscillation and then applying the other of these two signals at the desired time for oscillation.

(4) For suitably chosen values of the parameters of the circuit, the oscillation of the parametric oscillator is stabilized at a given saturation amplitude.

It should be remembered that the pump frequency is chosen equal to twice the resonance frequency of the oscillating circuit and the locking signal has a frequency equal to half that of the pump signal.

Figure 1:
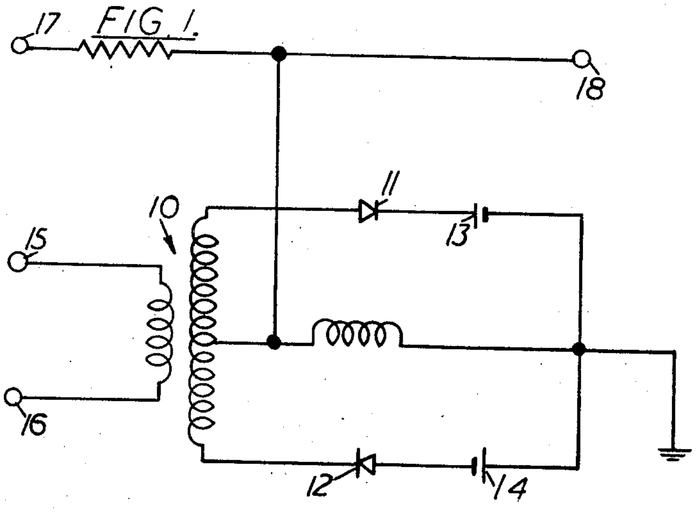
FIG. 1 is a schematic diagram of a sub-harmonic phase-locked parametric oscillator with lumped constant circuit elements.

FIG. 1 illustrates a parametric oscillator with lumped constants designed for pump frequencies which may reach 10 megacycles per second. The oscillating or resonant circuit includes the secondary winding of transformer 10 and the capacity of diodes 11 and 12 which are reverse biased by batteries 13 and 14. The pump signal is applied to the primary of transformer 10 between terminals 15 and 16 and the locking signal on the input terminal 17. The output signal of the parametric oscillator is extracted on terminal 18. Two diodes are used to balance the circuit so that the pump signal does not appear on the output terminal 18 and so the output signal does not appear at the pump signal input terminals 15 and 16.

Figure 2:
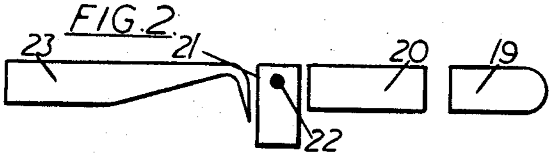
FIG. 2 is a schematic illustration of a sub-harmonic phase-locked parametric oscillator with distributed constant circuit elements.

FIG. 2 illustrates a parametric oscillator with distributed constants which may operate at frequencies of several thousands of megacycles per second. The pump signal is applied to line 19 coupled by known techniques to filter 20 and then to resonant cavity 21. A parametric diode 22 is placed inside cavity 21 which is coupled by known techniques to the locking signal input and output signal circuit 23. The physical connections between the various components have been eliminated in this schematic illustration to prevent obscuring the basic components of the circuit. Coupling between the various components can be obtained by known electrostatic or inductive means.

Figure 3:
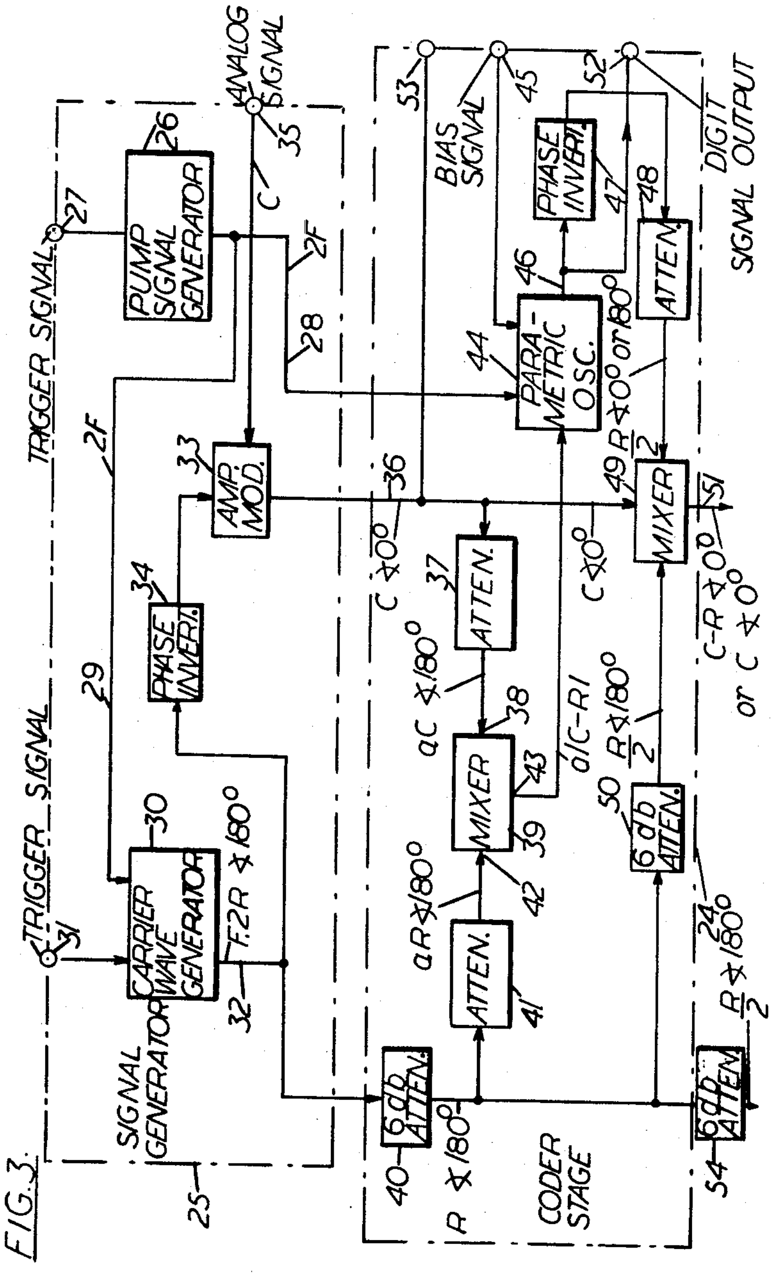
FIG. 3 is a schematic diagram in block form of a single coder stage in accordance with the principles of the present invention.

FIG. 3 illustrates a schematic diagram in block form of one coder stage 24 of the analog to digital converter of the present invention in cooperation with signal generator 25.

The signal generator 25 comprises a pump signal generator 26 triggered by signals applied on its input terminal 27 and which delivers at its output a pump signal of frequency 2F. The pump signal is applied first to conductor 28 and second over conductor 29 to one input of carrier wave generator 30. Generator 30 is activated by a trigger signal applied on terminal 31 to divide by two the pump signal frequency and provide a carrier wave or reference signal of predetermined amplitude. Thus, on conductor 32 appears a signal of frequency F having an amplitude 2R. The trigger signal at terminals 27 and 31, for example, could be supplied from the sampling generator (not shown) usually present in coding systems.

The signal on conductor 32 is coupled directly to coder stage 24 and also to one input of modulator 33 after a phase inversion in phase inverter 34. The analog signal to be coded having an amplitude C present at terminal 35 is coupled to the other input of modulator 33. The peak amplitude 2R of the carrier wave delivered by generator 30 has been chosen equal to the maximum amplitude $C_M$ that the signal to be coded may reach. Under these conditions, the output signal of modulator 33 present on conductor 36 is a carrier wave which can be amplitude modulated from 0 to 100% by the signal to be coded and having a phase taken equal to 0°. The signal on conductor 32 will have a phase of 180° relative to the modulated signal output of modulator 33. The signals on conductors 32 and 36 are applied to coder stage 24.

The modulated signal on conductor 36 is coupled to attenuator 37 and then to input 38 of mixer 39. The reference signal on conductor 32 is coupled to attenuator 40 having a 6 db (decibel) attenuation operating to reduce the amplitude of the reference signal by one half of the value R. The reference signal at the output of attenuator 40 is coupled to attenuator 41 and then to input 42 of mixer 39. Attenuators 37 and 41 are adjusted to attenuate the signals passing therethrough identically.

If attenuators 37 and 41 are identical and bring an insertion loss of $a$, where $0<a<1$, the signal applied on input 38 has an amplitude $a$C and a phase of 0° and the signal applied on input 42 has an amplitude $a$R and a phase of 180°. Two signals of opposed phase are therefore compared in mixer 39. It is known that under these conditions the signals V appearing on output 43 of mixer 39 will have an amplitude equal to the difference of the two amplitudes and the phase of the signal of higher amplitude:

$$V=a|C-R|$$

and if $$C-R>0$$

the signal V has a phase 0°.

if $$C-R<0$$

the signal V has a phase 180°.

This signal V is used as a locking signal for the parametric oscillator 44 which also receives the pump signal over conductor 28 and the bias voltage from terminal 45. The oscillation signal of parametric oscillator 44 reaches an amplitude which is limited by the saturation of the diode and thus is constant. The output signal on conductor 46 is extracted from this oscillation signal and thus has a constant level, the amplitude of which is dependent on the amplitude of the locking signal. The phase of the oscillation signal and, hence, the output signal extracted therefrom is determined by the phase of the locking signal.

The phase of the output signal on conductor is reversed in phase inverter 47 and the amplitude of the resulting signal is attenuated in attenuator 48 to an amplitude equal to one half the amplitude of the reference signal at the output of attenuator 40, namely, $$\frac{R}{2}$$

The output signal from attenuator 48 is coupled to one of the inputs of mixer 49. Mixer 49 has two other inputs: the input which receives the modulated carrier having an amplitude C and a phase of 0° from modulator 33 and the input which receives the reference signal having an amplitude attenuated by 6 db, i.e. reduced to $$\frac{R}{2}$$

in attenuator 50 and having a phase of 180°.

Mixer 49 which receives three signals whose phase is either 0° or 180° operates in the same way as mixer 43. The characteristics of the signal which appears on its output 51 can vary only according to the signal at the output of attenuator 48, the only signal applied to mixer 49 having variable characteristics. If $C-R\geqq 0$, the phase of the locking signal as well as that of the oscillation of the parametric oscillator is 0°. After inversion and attenuation in circuits 47 and 48 the output signal of the parametric oscillator has an amplitude $$\frac{R}{2}$$

and a phase of 180°. The result of the addition of the three input signals to mixer 49 is a signal having an amplitude $C-R$ and a phase of 0°. If $C-R<0$, the phase of the oscillation of the parametric oscillator is 180° and the signal at the output of attenuator 48 has an amplitude of $$\frac{R}{2}$$

and a phase of 0°. The result of the addition of the three signals in mixer 49 is a signal having an amplitude C and a phase of 0°.

By referring to the description of the feedback coding circuits hereinabove, it is seen that if the phase of the signal on conductor 46 is taken as indicating the digit obtained by the coding operation, the signal present on output 51 is the signal which has to be applied to the input of the coder stage of weight immediately lower.

With the conventions adopted, a digit $\underline{1}$ will be obtained on the output terminal 52 if the output signal of parametric oscillator 44 is in phase with the signal delivered by modulator 33, and a digit $\underline{0}$ if the output signal of the parametric oscillator is of opposite phase.

It may be written that the signal which remains to be coded is:

$$C_1=C-\alpha_1 R$$

with $$\alpha_1=\underline{1}$$

if the phase of signal on conductor 46 is 0°, or $$\alpha_1=\underline{0}$$

if the phase of signal on conductor 46 is 180°. In this equality, $C_1$ represents the signal which remains to be coded after the determination of the digit of rank 1. For the determination of the digit of the next rank, signal $C_1$ will be applied to conductor 36 of a second coder stage 24, identical to the preceding one, or to terminal 53 of the same coder stage after having been delayed.

As it has been seen, it is necessary, in order to proceed from one coder stage to the following one, either to attenuate by one half the reference signal, or to double the amplitude of the signal which remains to be coded. In the first solution, an attenuator 54 identical to the attenuator 40 can be coupled to the output of attenuator 40. In the second solution, used preferably in a converter with a single coder stage, an amplifier with a gain of 6 db and a delay circuit is disposed in the feedback circuit.

Three alternative embodiments of analog to digital converters will now be described employing the coder stage hereinabove described with reference to FIG. 3. These analog to digital converters are designed to operate with very high carrier frequencies, for example in the order of several kilomegacycles per second, and having distributed constant circuits, i.e. circuits equipped with waveguides and their accessories.

Before proceeding with the description of these arrangements the symbols employed in the schematic diagrams will be discussed with reference to FIGS. 4A to 4G and 5A to 5C.

Figure 4A:
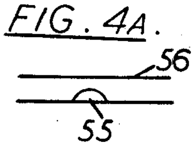
FIGS. 4A to 4G illustrate symbols used in the schematic diagrams of embodiments of the present invention illustrated in FIGS. 6, 7, and 10 employing wave-guide circuits.

FIG. 4A is the symbol showing a phase shifter 55 placed in a waveguide 56 which shifts the phase of the wave circulating therethrough.

Figure 4B:
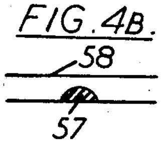

FIG. 4B is the symbol showing an attenuator 57 to attenuate a given amount the wave circulating through the waveguide 58.

Figure 4C:
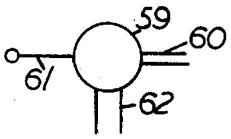

FIG. 4C is the symbol showing a parametric distributed constant oscillator 59 such as the one shown in FIG. 2. Parametric oscillator 59 has a waveguide 60 to receive the pump signal, a conductor 61 to receive the bias signal and a waveguide 62 to receive the locking signal and which also provides the output on which the oscillation of the parametric oscillator is collected.

Figure 4D:
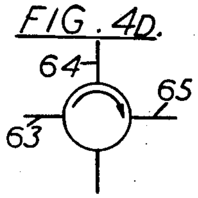

FIG. 4D is a well knonw symbolic representation of a circulator. It is known that the circuit has the property that a wave applied to the line 63 can only appear at the line 64, and that a wave applied to the line 64 can only appear at the line 65 and so forth.

Figure 4G:
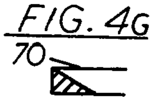
Figure 4E:
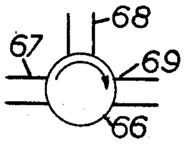

FIG. 4E represents the symbol of a circulator 66 which has only three waveguide terminals 67, 68, and 69. In this circuit, a wave entering through waveguide 67 will only appear at waveguide 68 and a waveguide 68 and a wave entering through waveguide 68 will only appear at waveguide 69.

Figure 4F:
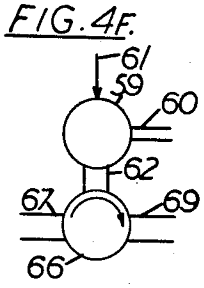

If the circulator 66 of FIG. 4E is associated with the parametric oscillator 59 of FIG. 4C, the symbolic diagram of FIG. 4F is obtained. If the locking signal of parametric oscillator 59 is applied to waveguide 67, and if the output signal is collected in waveguide 69, it is seen that the two functions have been perfectly isolated one from the other by means of the circulator 66.

FIG. 4G is a symbol of a matched load where the energy of a signal applied to waveguide 70 is completely dissipated therein without reflection.

Figure 5A:
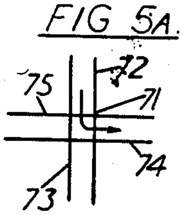
FIGS. 5A to 5C illustrate symbols of directional couplers employed in the embodiments of FIGS. 6, 7, and 10.

FIG. 5A is the symbol used to represent directional coupler 71 of the "cross type," such as described in volume 8 of the "Radiation Laboratories Series" of the M.I.T., edition 1948, page 438, in which $\theta=180°$. If a 20 db coupler is used and the waveguides are matched, it is known that:

If a signal is applied to waveguide 72, 99% of the energy appears in waveguide 73 and 1% in waveguide 74, with the signal appearing in waveguide 74 being 90° out of phase with respect to the signal in waveguide 72.

If a signal is applied to waveguide 75, 99% of the energy appears in waveguide 74 and 1% in waveguide 73 with the signal appearing in waveguide 73 being 90° out of phase with respect to the signal in waveguide 75 and so on.

Figure 5B:
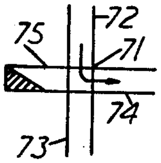

FIG. 5B represents directional coupler 71 whose waveguide 75 is not used and is matched by means of a load as shown in FIG. 4G. The grouping of a certain number *n* of these circuits mounted in series, i.e. by connecting waveguide 73 of a circuit to waveguide 72 of the following circuit, enables the coupling of the signals on the *n* waveguide 74 to an equal number of devices without interactions between the different waveguides 74.

Figure 5C:
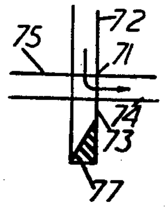

FIG. 5C represents another way of utilizing directional coupler 71. In this arrangement, 1% of the signal applied to waveguide 72 is mixed with the signal applied to waveguide 75 and 99% of the signal is dissipated in the matched load 77. If the signals are in phase or in opposite phase, a signal representing the algebraic addition of the two signals is obtained in waveguide 74. This circuit constitutes a mixer for two signals equivalent to mixer 43, FIG. 3. A mixer for three signals having the same function as mixer 49, FIG. 3, may be constructed by connecting waveguide 74 of the mixer of FIG. 5C to one of the waveguides 75 or 72 of a second similar circuit, the free waveguide of the second circuit, for instance, waveguide 72, receiving the third signal. In the course of the following description, reference shall be made indifferently either of power ratios or of voltage ratios since the described circuits operate at a constant frequency and are always perfectly matched.

Figure 6:
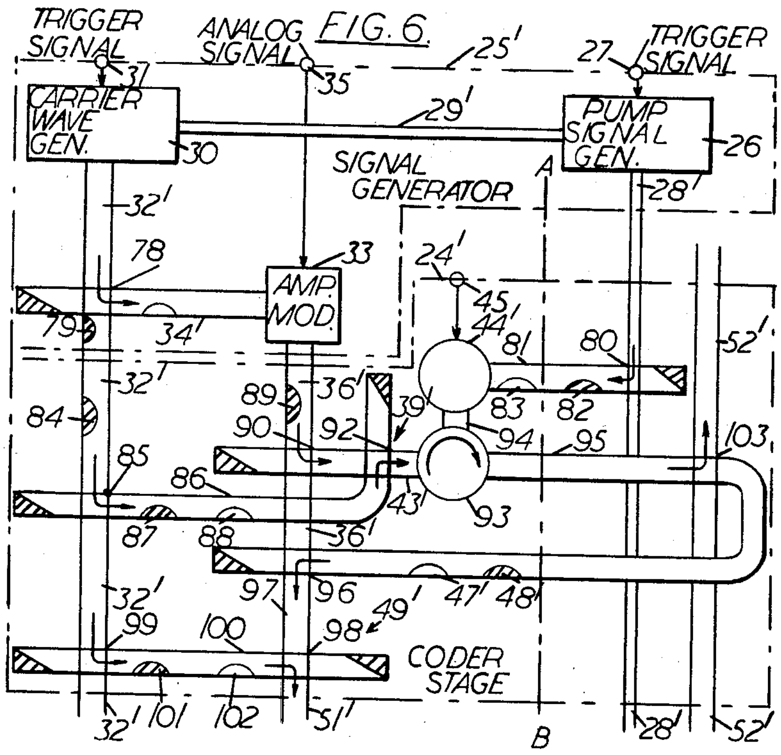
FIG. 6 is a schematic diagram employing symbols of FIGS. 4A to 4G and 5A to 5C of an embodiment of a coder stage in accordance with the principles of this invention utilizing distributed constant circuit elements.

FIG. 6 is a schematic diagram of coder stage 24′ and signal generator 25′ employing distributed constant circuit elements, such as described in connection with FIGS. 4A to 4B and 5A to 5C. In FIG. 6, the same reference characters will be employed for those circuit elements identical to the corresponding circuit elements of FIG. 3 and primed reference characters will be employed for modifications of the corresponding circuit elements of FIG. 3.

Signal generator 25′ comprises a pump signal generator 26 supplying a pump frequency signal for the production of a carrier wave and reference signal and for the parametric oscillator in coder stage 24′. The pump signal from generator 26 is coupled over waveguide 29′ to carrier wave generator 30 and at the same time is coupled from generator 26 via waveguide 28′ to coder stage 24′. The reference signal output from generator 30 is coupled over waveguide 32′ to amplitude modulator 33 and the coder stage 24′. The reference signal having an amplitude of 2R and a phase of 180° is coupled to a directional coupler 78 which extracts a fraction of the reference signal to be employed as a carrier wave for modulator 33. Attenuator 79 in waveguide 32′ is employed to compensate for the attenuation of coupler 78 so that the signal coupled to coder stage 24′ on waveguide 32′ has the same amplitude (2R) as the signal applied to modulator 33. The output of coupler 78 is coupled to phase shifter 34′ to invert the phase of the reference signal prior to application to modulator 33. The analog signal to be coded is coupled from terminal 35 to modulator 33 and the resultant amplitude modulated output of modulator 33 having an amplitude C is delivered by waveguide 36′ to coder stage 24′.

Coder stage 24′ includes parametric oscillator 44′ to which is applied a bias signal from terminal 45, a pump signal from waveguide 28′, and a locking signal resulting from the mixing of the signal on waveguide 36′ and 32′ as produced in a manner to be described hereinbelow. The pump signal is delivered from waveguide 28′ to oscillator 44′ by means of a directional coupler 80 to deliver a fraction of the pump signal via waveguide 81 to oscillator 44′. Waveguide 81 includes therein attenuator 82 and phase shifter 83 to suitably attenuate and phase shift the pump signal to compensate for any attenuation and phase shift that may occur at coupler 80.

The phase locking signal is produced in the following manner. The reference signal on waveguide 32′ having a phase of 180° is coupled to attentuator 84 to reduce the amplitude thereof to one half of the amplitude of the signal at the output of generator 30. Directional coupler 85 extracts a portion of this reference signal for application along waveguide 86 to mixer 39′. The reference signal in waveguide 86 is acted upon by attenuator 87 to attenuate the amplitude thereof to an amplitude $a'$R and the resultant attenuated signal is phase shifted by element 88 to compensate for phase shifts due to the length of the waveguides and the passage of the wave in the directional couplers. At the same time the modulated output of modulator 33 on waveguide 36′ is attenuator 89 to a value of $a''$C for application to directional coupler 90 which extracts a fraction of the modulated signal on waveguide 36′ for application to waveguide 91. $a'$ and $a''$ to which the amplitude of the reference signal and modulated signal in waveguides 86 and 36′ have been reduced, range between 0 and 1. The resultant signal on waveguide 86 and 91 are coupled to mixer 39′ in the form of a directional coupler 92 with the resultant mixed signal being present on waveguide 43′. The attenuations $a'$ and $a''$ have been chosen in accordance with the attenuation brought by the directional couplers so that the signal present in the waveguide 43′ has an amplitude proportional to C–R.

The signal on waveguide 43′ having the function of a locking signal is coupled to circulator or isolator 93 and is coupled to oscillator 44′ on waveguide 94. When the bias signal, pump signal and locking signal are simultaneously present at parametric oscillator 44′ it starts oscillating and the output signal appears in waveguide 94 with a much higher amplitude than that of the locking signal. The circulator 93 sends the resultant oscillating signal to the output wave guide 95. The signal in waveguide 95 is attenuated by attenuator 48′ by an amount sufficient to produce a resultant amplitude equal to $$\frac{R}{2}$$

and phase shifted by phase shifter 47′ by an amount such that after mixing with the signal in waveguide 36′ the resulting phase can only be either 0° or 180°. The signal at the output of phase shifter 47′ is mixed with the modulated signal output of modulator 33 and the reference signal on waveguide 32′ in mixer 49′. Mixer 49′ includes directional coupler 96 to mix the signal at the output of phase shifter 47′ with the signal on waveguide 36′ to provide a resultant signal in waveguide 97. This resultant signal is then coupled to one input of directional coupler 98. The other input of coupler 98 receives a portion of the reference signal in waveguide 32′ by means of directional coupler 99 and waveguide 100. Waveguide 100 includes attenuator 101 to attenuate the reference signal by an amount sufficient to produce a resultant amplitude equal to $$\frac{R}{2}$$

and phase shifter 102 to shift the phase of the signal in waveguide 100 by an amount so that the resultant output signal on waveguide 51 can only have a phase of 0°. Like phase shifter 88, phase shifter 102 compensates for the phase shifts due to the length of the waveguide and the passage of the signals in the directional couplers.

This distributed constant circuit operates in the same way as the circuit of FIG. 3. As it has been specified in connection with FIG. 3, the phase of the signal at the output of phase shifter 47' is opposite to that of the phase of the locking signal on waveguide 43' which is dictated by the result of the comparison carried out in mixer 39'. The signals present in waveguides 95 and 100 have been attenuated by attenuator 48' and 101 down to an amplitude equal to $$\frac{R}{2}$$

and the signal in waveguide 36' has an amplitude proportional to C. The signal present in waveguide 95 is sent to the output waveguide 52' through directional coupler 103 and the phase of this signal characterizes the digit obtained by the coding; $\underline{1}$ if the phase is 0° and $\underline{0}$ if the phase is 180°. The signal remaining to be coded in waveguide 51' has a value $C-R$ or C with a phase of 0° depending on the phase of the signal at the output of phase shifter 47' which is 180° out of phase with the signal in waveguide 95.

Figure 7:
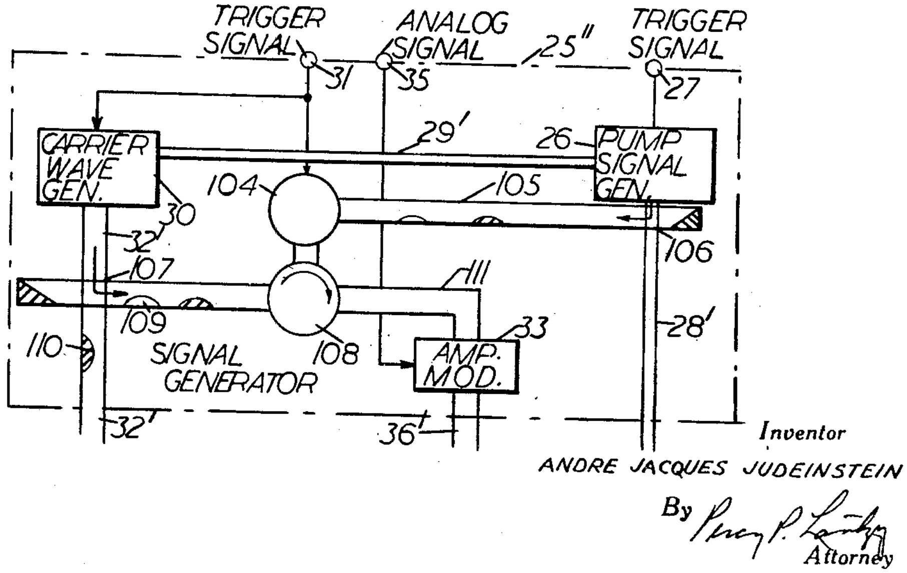
FIG. 7 is a schematic diagram employing symbols of FIGS. 4A to 4G and 5A to 5C of an embodiment of the signal generator.

FIG. 7 represents an alternative solution of the signal generator. The reference voltage, as in generators 25 and 25' of FIGS. 3 and 6, respectively, is obtained from generator 30 which is excited by the output signal from pump frequency generator 26. The difference between generator 25'' and generators 25 and 25' is the manner in which the carrier wave to be modulated in modulator 33 by the analog signal at terminal 35 is produced. The carrier wave is generated by parametric oscillator 104 which receives pump signals over waveguide 105 by means of directional coupler 106. The locking signal is obtained from the reference signal on waveguide 32' by means of directional coupler 107. The input and output signals of parametric oscillator 104 are separated by circulator 108. Since the phase angle of the signal at the output of modulator 33 has to be 0°, the locking signal of parametric oscillator 104 must also have a phase angle of 0°. Since the signal in waveguide 32' must have the phase angle of 180°, phase shifter 109 provides the necessary phase shift. An attenuator 110 is placed in waveguide 32' to ensure that the reference signal coupled to the coder stage by waveguide 32' and the signal at the output of circulator 108 in waveguide 111 have the same amplitude 2R.

Figure 8:
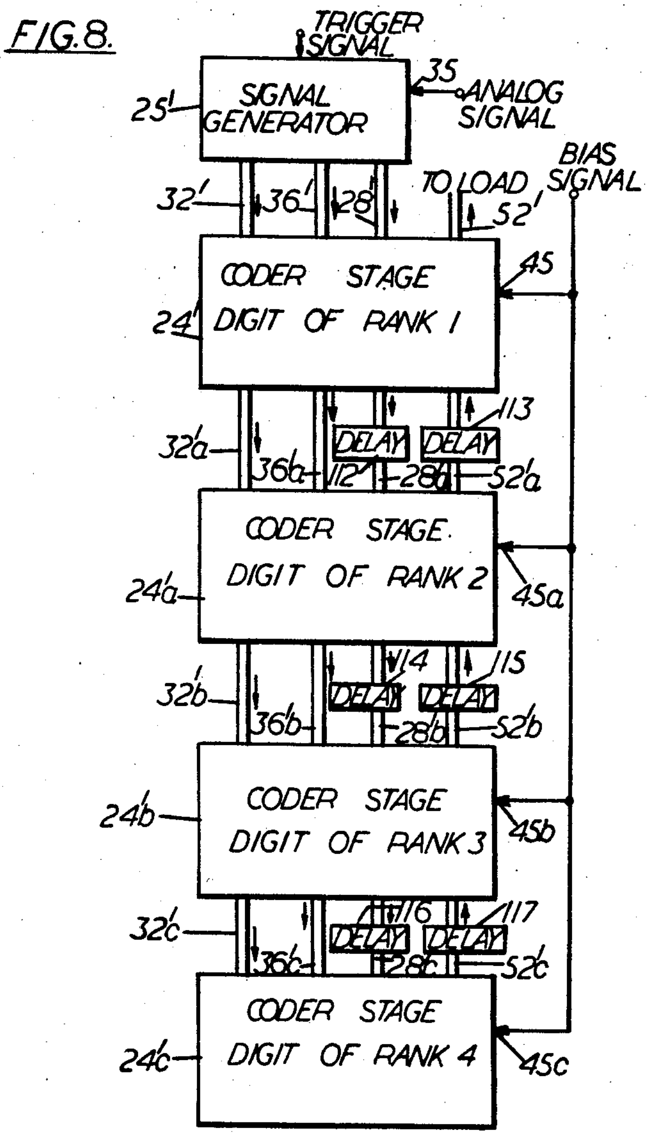
FIG. 8 is a schematic diagram in block form of an embodiment of a multi-stage analog to digital converter in accordance with the principles of the present invention.

FIG. 8 is a schematic diagram in block form of an embodiment of an analog digital converter having $n=4$ coder stages 24' to 24'c of the distributed constant coder stage type illustrated in FIG. 6. Arrows have been placed adjacent the waveguides interconnecting the signal generator and the coder stages to indicate the direction of signal propagation. It will be observed that delay circuits 112 to 117 have been placed in the waveguides 28' and 52' interconnecting coder stages 24' to 24'c. The bias signal is applied in parallel and permanently on all the coder stages via terminals 45 to 45c so that the switching operation will be carried out through the pumping signal. As explained hereabove with reference to FIG. 3, the amplitude of the reference signal will be reduced 6 db from one stage to the stage of weight immediately lower. This is accomplished in the circuit of FIG. 8 by means of attenuator 84 (FIG. 6) placed in each coder stage 24'. The amplitudes of the signals in waveguides 36', 86 and 100 (FIG. 6) are thus always correct but the insertion loss presented by attenuator 48', acting upon the signal in waveguide 95 must be increased by 6 db per stage owing to the fact that the signal output of parametric oscillator 44' in waveguide 95 has a constant amplitude in all the stages. The build up and extinction times of the stabilized oscillation in parametric oscillator 44' (FIG. 6) will be respectively $t_2$ and $t_e$. When the pump signal is applied to one of the parametric oscillators of the converter, the amplitude of the oscillation is stabilized with a time lag of $t_2$ with respect to the time of application of the pump signal. When the modulated signal output of modulator 33 is coupled into input waveguide 36' of the first coder stage 24', it appears almost instantaneously in the output waveguide 51' whereas parametric oscillator 44' delivers its signal only after a time lag $t_2$. Between the times 0 and $t_2$ the signal in waveguide 51' is, therefore, not the signal which remains to be coded in stage 24'a and its amplitude varies during the build up time of the oscillation in parametric oscillator 44'. This is a parasitic signal which must not be able to act as the locking signal for the parametric oscillator of stage 24'a. The delay circuits 112, 114, and 116 are interposed in waveguides 28'a, 28'b and 28'c which transmits the pump signal to introduce a time lag $t \geqslant t_2$ so that, for instance, the parametric oscillator of stage 24'a can start oscillating only when the amplitude of the oscillation in the parametric oscillator of stage 24' is stabilized.

Figure 9:
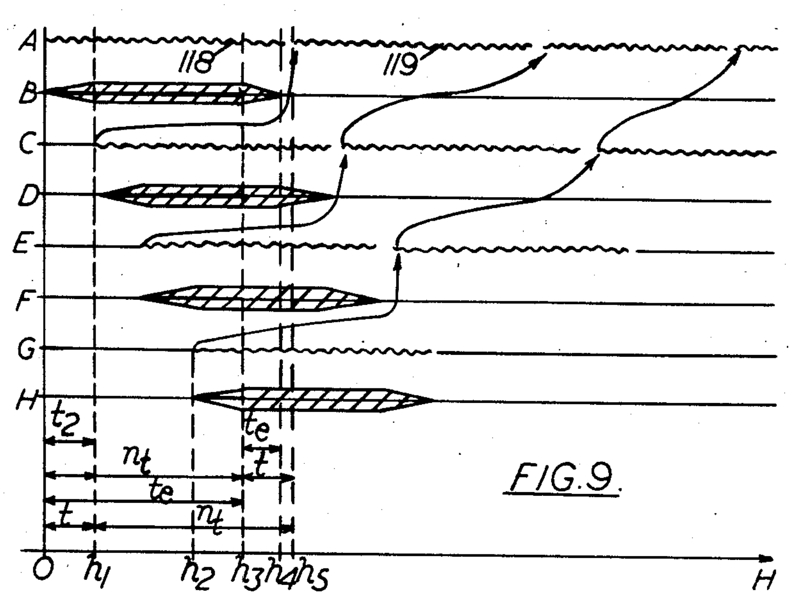
FIG. 9 illustrates the signals present in the circuit of FIG. 8.

FIG. 9 illustrates on a time scale OH the signals present in the converter of FIG. 8. The oscillation signals of the parametric oscillators of coder stages 24' to 24'c have been illustrated at curves B, D, F, and H, respectively, in the form of hachured signals, the amplitude of which is variable during the build-up time $t_2$ and extinction time $t_e$ of the oscillation. The pump signals have been represented inside the oscillation signals in the form of horizontal solid lines, the duration of which, for the signal of stage 24' is 0 to $h_3$. It is seen that the times of application of these pump signals are delayed by a time $t$ per stage.

In FIG. 9, as a nonlimiting example, $t=t_2$ and $t>t_e$ and it will be assumed that the duration of the pumping signal is $t_p$. The signals which are present in the output waveguides 52', 52'a, 52'b, and 52'c have been represented in curves A, C, E, and H, respectively, in the form of wavy lines without attempting to illustrate amplitude variations during the build up and extinction time. In each stage, the signals coming from the parametric oscillator of that stage are shown above the diagram of the oscillation signal of this oscillator. Although each oscillator reaches its maximum amplitude only after a time lag of $t$ with respect to the application of the pumping signal, and although this amplitude begins to decrease just at the suppression of the pumping signal, the output signals must be considered to have a duration of $t_p+t_e$ in order to be sure that outside this time interval the parametric oscillator does not deliver any signal.

The application of the pump signal to two successive stages is delayed by a time $t$. Hence, the pump signal is applied with a time lag $(n-1)t$ to the parametric oscillator of rank $n$ (at the time $h_2$ for the parametric oscillator of coder 24'c in the example considered) and the oscillation therein is stabilized with a time lag $nt$ at time $h_3$. The duration of the signal delivered by modulator 33 must thus be at least equal to $nt$ since said signal propagates without appreciable delay in the waveguides 36' and 51' of the various stages. On the other hand, the amplitude of the signal which remains to be coded applied to the stage to determine the digit of rank $n$ depends upon the results of the coding carried out in all preceding stages so that the duration of the pumping signal must also be $t_p=nt$. The output signal of stage 24', which is the signal referenced 118 in the curve A, FIG. 9, appears between the times 0 and $h_4$, a duration of $nt+t_e$. The signal coming from stage 24'a must appear after time $h_4$. Since $t>t_e$, it is seen that this signal, reference 119 in curve A, FIG. 9, may appear at the output of stage 24′ with a time lag of $t$ with respect to the time when the pump signal of stage 24′ is suppressed i.e. to the time $h_5$. Since the pump signal is applied to stage 24′$a$ at the time $h_1$, the delay that has to be applied to the output signal of stage 24′$a$ is $h_5-h_1$. Since $h_5=nt+t$ and $h_1=t$, this delay is, therefore, $nt$ and it is supplied by each one of delay circuits 113, 115, and 117. These delays have been represented in FIG. 9 by means of arrows linking curves A, C, E, and G illustrating the signals at the output of the various stages. The time interval between the beginning of the output signal of stage 24′ and the beginning of the output signal of stage 24′$a$ is $h_5-0$, i.e. $nt+t=t(n+1)$. The total duration of the coding for $n$ digits is thus:

$$W'_1=nt(n+1) \quad (1')$$

This time may be slightly reduced if the delay brought to the transmission of the output signals from one stage to the stage of rank immediately higher is reduced by a quantity $h_5-h_4=t-t_e$, i.e. if it is brought back to $$t(n-1)t_e$$

The duration of the coding then becomes:

$$W_1=n\ (nt+t_e) \quad (1)$$

It is seen that in this circuit the parametric oscillators of the different stages start oscillating at times separated by $t$, but the fact that it is necessary to wait for the extinction of the oscillation of a parametric oscillator of a given rank before transferring in the output waveguide the information delivered by the oscillator of rank immediately lower give rise to a considerable increase in the coding duration. In order to obviate this inconvenience, the output signal of the parametric oscillator of a given stage, the phase angle of which represents the information determined in this stage, and the common information signal in the output waveguide for each coder stage may be separated, for example, in the manner described hereinbelow with reference to FIG. 10.

Figure 10:
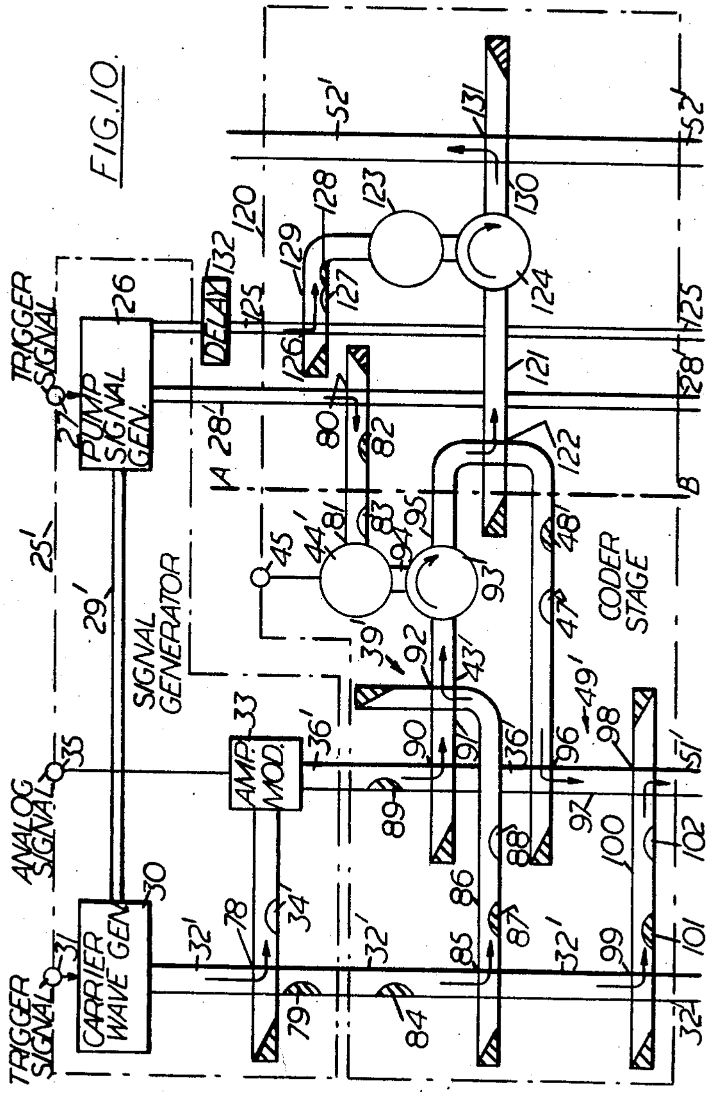
FIG. 10 is a schematic diagram employing symbols of FIGS. 4A to 4G and 5A to 5C of an alternative arrangement for the coder stage of FIG. 6.

FIG. 10 illustrates in schematic diagram form an embodiment of coder stage 24′, FIG. 6, in which the duration of the coding is reduced by modifying the circuit at the right of line AB of coder stage 24′, FIG. 6, the stage thusly modified being identified by reference character 120. The waveguide 95 which transmits the signal delivered by parametric oscillator 44′ is not connected to the output waveguide 52′ but rather is connected to waveguide 121 by means of directional coupler 122. The waveguide 121 feeds a second parametric oscillator 123 through circulator 124. This signal is used as the locking signal for oscillator 123 which receives a pump signal by means of waveguide 125 and directional coupler 126. Phase shifter 127 and attenuator 128 have been placed in waveguide 129 at the output of directional coupler 126 to perform the same function as attenuator 82 and phase shifter 83 in waveguide 81 which transmits the pump signal to parametric oscillator 44′. The output oscillation of oscillator 123 is transmitted by circulator 124 to waveguide 130 through directional coupler 131 to output waveguide 52′ common to all stages. The pump signal feeding parametric oscillator 44′ again has a duration of $nt$ and the delay between two adjacent stages is $t$.

Figure 11:
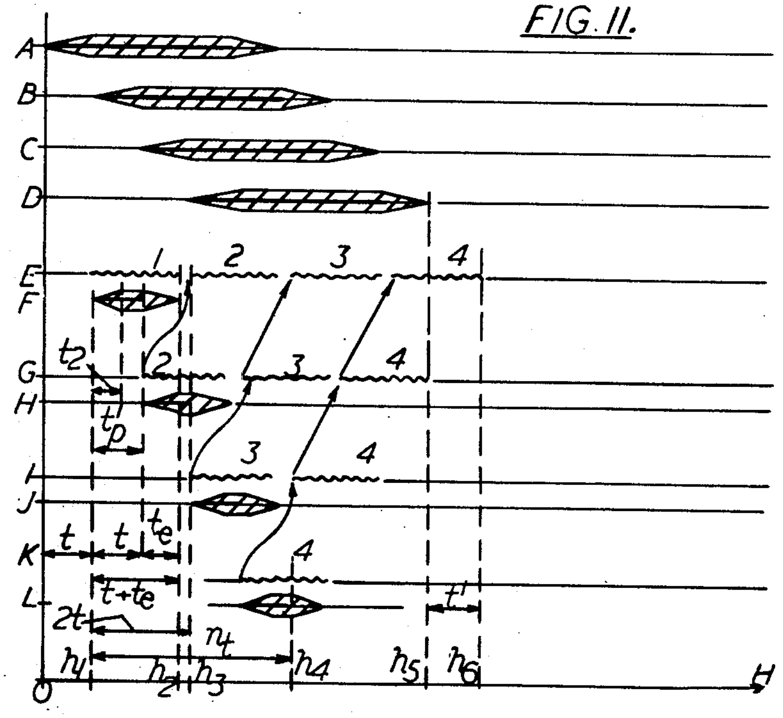
FIG. 11 illustrates the signals present in the circuit of FIG. 10.

FIG. 11 illustrates on a time scale OH, the signals present in a four stage converter utilizing coder stages 120, FIG. 10. As in FIG. 9, the oscillation signals of parametric oscillator 44 of the various stages are shown in curves A, B, C, and D. In order to obtain a safe operation of parametric oscillator 123, FIG. 10, it is necessary to wait until its locking signal on waveguide 121 reaches its maximum amplitude before applying the pump signal from waveguides 125. This signal will thus be applied to the first coder stage at the time $h_1$ representing a time lag $t$ produced by delay circuit 132 with respect to the time of application of the pump signal in waveguide 33 to parametric oscillator 44′ of the same stage and it will be delayed by $t$ from one stage to the following one in the same way as is accomplished for the pump signal in waveguide 28′. If $t'_p$ designates the duration of the pump signal in waveguide 125, this pump signal for the different stages is illustrated by the horizontal solid lines in the hachured signals in curves F, H, J, and L. The signals present in output waveguide 52′ are represented in curves E, G, I, and R, respectively. The oscillation signals in curves F, H, J, and L have been represented with $t>t_2$, so that if the pump signal in waveguide 125 has a duration of $t'_p=t$, the oscillation signal has its maximum amplitude for a duration equal to $t-t_2$. The total duration of the output signal is $t+t_e$. The time lag brought to the propagation of the output signal from the second stage to the first stage is $t$ and this signal first appears in the first stage at time $h_3$. The time elapsed between the beginning of the output signals of the first and second states is $2t$ and the duration of the coding is $W'_2=2nt$. As in the circuit of FIG. 8, the duration may be reduced by reducing the delay between stages to $t_e$. When this time delay is present the signal of the second stage appears as soon as the signal of the first stage is off and the coding duration, $h_6-h_1$, is:

$$W_2=n(t+t_e) \quad (2)$$

The intitial time lag $t$ of the pump signal in waveguide 125 with respect to the pump signal in waveguide 28′ has not been taken into account in this calculation. In fact, if it is desired to work at the maximum possible speed, it is seen in FIG 11, that a conversion operation may start at the time $h_5$, that is, $t'$ before the end of the output signal coming from the stage of rank $n$.

With reference to FIGS. 8 to 11 two converters which deliver output informations in a series form have been described.

An output in a parallel form can also be obtained from both the converters by not connecting output waveguide 52′ to the adjacent stages. In the circuit of FIG. 8 each one of the outputs of couplers 103 (FIG. 6) must be connected to a bistable device, for example, a parametric oscillator, and the whole assembly of these $n$ parametric oscillators constitute a register in which the number is available in parallel form. In the case of the circuit of FIG. 10, and as a nonlimiting example, parametric oscillator 123 of each stage may constitute this register. It is then sufficient that the pump signal in waveguide 125 should have a duration at least equal to the time elapsed between the initiation of the oscillation in the parametric oscillator 123 of the stage of rank 1 and the end of the oscillation in the parametric oscillator 123 of the stage of rank $n$. By referring to FIG. 11, it is seen that the duration of the pump signal in waveguide 125 must be $h_4-h_1$, namely, $nt$.

In the circuits just described, the respective roles of the pump signal and of the bias signal may be reversed. The pump signal may be permanently applied and the bias signal may be applied in time succession on the the parametric oscillators of the various stages.

Figure 12:
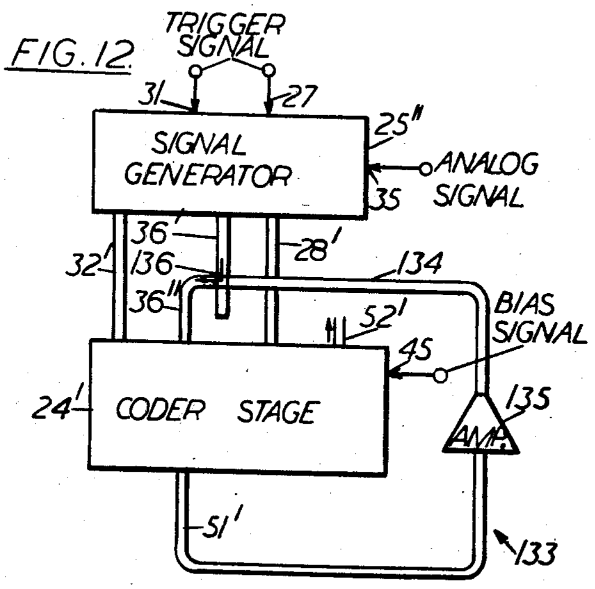
FIG. 12 is a schematic diagram in block form of a single coder stage analog to digital converter in accordance with the principles of the present invention.

FIG. 12 illustrates another embodiment of a converter in accordance with the principles of this invention using coder stage 24′ of FIG. 6. This converter comprises only one coder stage receiving the pump, reference and amplitude modulated signals from signal generator 25″ of FIG. 7. The output waveguide 51′ of this stage is connected to its input waveguide 36″ through a delay loop 133 comprising waveguides 51′ and 134″ interconnected by amplifier 135. At the input of stage 24′, the coupling between the waveguide 134″, waveguide 36′ and waveguide 36″ is carried out through the directional coupler 136. T will designate the time lag brought by delay loop 133.

The amplifier 135 being inserted in the circuit of the signal to be coded, the reference signal in waveguide 32′ will have a constant amplitude during the coding duration of a number, and the amplitude of the signal in waveguide 51' which remains to be coded will be amplified to an appropriate value so that the signal in waveguide 36'' applied to the input of stage 24' will have an amplitude $2(C-\alpha R)$. The first signal to be coded, delivered by generator 25'', is submitted to an attenuation of 20 db in coupler 136, account being taken of this attenuation in the attenuation of the reference signal by appropriately choosing the attenuation brought by attenuators 84 and 101 of FIG. 6.

Figure 13:
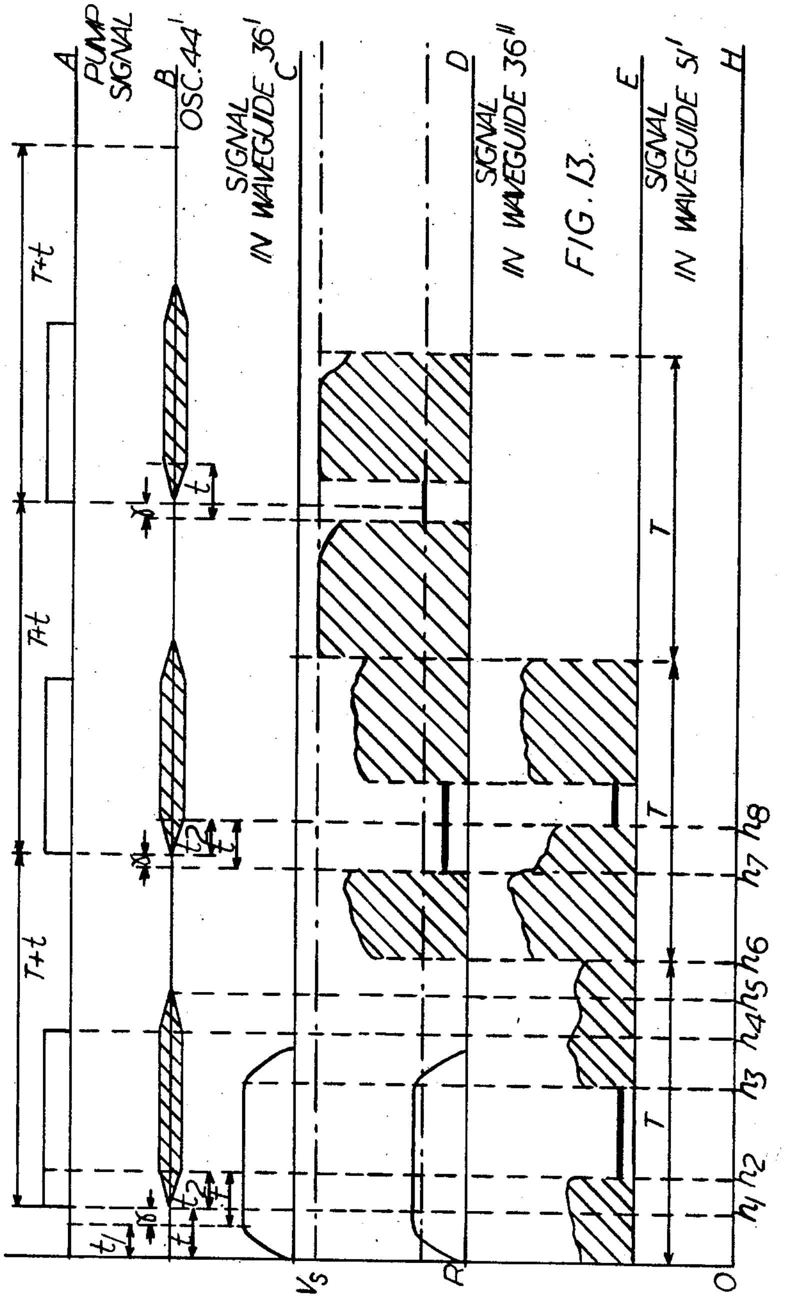
FIG. 13 illustrates the signals present in the circuit of FIG. 12.

FIG. 13 illustrates on a time scale OH the signals which appear in various points of the circuit of FIG. 12. The pump signals applied to oscillator 44' (FIG. 6) are shown in curve A, the oscillation signal in this oscillator is shown in curve B, the signal to be coded delivered by oscillator 104 and modulator 33 (FIG. 7) is shown in curve C, the signals which are present on the input waveguide 36'' of the coder stage are shown in curve D, and the signals present on the output waveguide 51' are shown in curve E. Before determining the parameters of the circuit, the operation of this coder shall be studied briefly. The triggering signal at terminal 28 is applied to generator 25'' at the time 0 and the first pump signal appears at time $h_1$. The amplitude of the oscillation of parametric oscillator 44' stabilizes itself at time $h_2$ and it lasts up to time $h_4$ corresponding to the suppression of the pump signal. On the other hand, the amplitude of the signal to be coded is constant up to time $h_3$.

Last, since the time delay of delay loop 133 is T, represented by the distance 0 to $h_6$, the signal present on the output waveguide 51' of the coder at time 0, curve C, appears on input waveguide 36'' at time $h_6$ with a doubled amplitude (curve D). It is seen in curve E that, in a period T, the delay of the feedback loop 133, three time intervals exist in which the signal in waveguide 36'' has different amplitudes:

(1) Between times 0 and $h_2$, i.e. before the amplitude of the oscillation of the parametric oscillator is stabilized, the signals present in the coder stage are the signals to be coded having amplitude C and the reference signal having an amplitude $$\frac{R}{2}$$

and of opposite phase with respect to that of signal to be coded so that on the output waveguide 51' a parasitic signal is obtained having a maximum amplitude $$C-\frac{R}{2}$$

(2) Between times $h_2$ and $h_3$, i.e. between the time when the amplitude of the oscillation of the parametric oscillator is stabilized and the time when the amplitude of the signal to be coded begins to decrease, the stage delivers on its output waveguide 51' the signal which remains to be coded $C-\alpha R$ of phase 0° ($\alpha$=0 or 1).

(3) Between times $h_3$ and $h_6$, the signal to be coded is suppressed, and parametric oscillator 44' is stopped. A second parasitic signal is obtained having an amplitude which varies approximately from $\alpha$R to $$\frac{R}{2}$$

and a phase which is slightly different from 0° or 180°.

The two parasitic signals are amplified at each passage through loop 133, but they are limited in amplitude by the saturation level $V_s$ of amplifier 135, curve D. The second parasitic signal which occurs after the triggering of the parametric oscillator cannot modify the phase thereof, as it has been previously pointed out in connection with the description of FIG. 8. In curves D and E, the hachured signals represent the parasitic signals. Their exact amplitude has not been indicated, this latter being very difficult to determine, since, in particular, the frequency of the oscillations in oscillators 44' and 104 vary during the build-up and extinction times.

The various parameters of the circuit shall now be determined.

Let:

$t_p$=the duration of the pump signal;
$t_c$=the duration of the signal to be coded;
$t_1$=the build-up time of the impulse to be coded;
$t_2$=the build-up time of the oscillation in parametric oscillator 44';
$T$=the time lag introduced by delay loop 133; and
$\gamma$=a safety margin on the build-up of the signals and is the minimum time during which the locking signal must be applied to parametric oscillator 44' where, $$\gamma<t_1 \text{ and } \gamma<t_2$$

It has been seen in the preceding description relative to FIG. 13 that the coder stage delivered the signal $C-\alpha R$ only after a time lag corresponding to the sum of the respective build-up times of the signal to be coded and of the pump signal, i.e., $t_1+t_2$. This time lag is due to the fact that the pump signal is applied only at the time $t_1$ in order to avoid the establishment of an erroneous phase in the parameteric oscillator. By adding a safety margin $\gamma$ related to the signal to be coded, it may be stated that the pump signal is applied at the time $t_1+\gamma$ and that the result of the coding is obtained commencing at a time $t_1+t_2\gamma$. This signal is applied at the input of the coder with a time lag T, i.e. commencing at a time $T+t_1+t_2+\gamma$. In order that the second oscillation starts at the beginning of this useful signal, the pump signal must be applied at exactly this time. In taking once again into account a safety margin $\gamma$, this pump signal will start at the time $T+t_1+t_2+2\gamma$.

The repetition period, $P_p$, of this pump signal is therefore:

$$P_p=(T+t_1+t_2+2\gamma)-(t_1+\gamma)=T+t_2+\gamma \qquad (3)$$

and at each coding, the useful signal to be coded shall be applied a time $\gamma$ before the beginning of the pump signal.

It is thus seen that the duration T of the delay introduced by the loop 133 is shorter than the repetition period of the pump signal by a quantity $t_2+\gamma$. It can be seen in comparing the curves of FIG. 13, particularly curves D and E, that the duration of the useful signal to be coded is reduced by $t_2+\gamma$ at each new coding operation. It is thus necessary to calculate the minimum duration of the signal to be coded, curve C, enabling the coding of an $n$ digit number. $t_c$, the duration of the signal to be coded, comprises the build-up time of said signal but does not include its extinction time. This duration corresponds to the duration during which the pump signal is applied to the parametric oscillator 104 of generator 25'', FIG. 7. The useful signal starts only at the time $h_2$, where 0 to $h_2=t_1+t_2+\gamma$. The useful duration of the signal to be coded delivered after the coding of rank 1 is thus $t_c-(t_1+t_2+\gamma)$. At the end of the $(n-1)$th coding, the useful duration of the output signal for the coding of rank $n$ is:

$$t_c-(t_1+t_2+\gamma)-(n-2)(t_2+\gamma)$$

In order that the coding of rank $n$ should be carried out correctly it is necessary that the useful signal coincides at least during a period $\gamma$ with the pump signal. Since it has been established previously that the useful signal was applied a time $\gamma$ before the pump signal, it may be written:

$$t_c-(t_1+t_2+\gamma)-(n-2)(t_2+\gamma)\geqslant 2\gamma$$

from which the condition of the minimum duration of the signal to be coded may be deduced.

$$t_c\geqslant(t_1+t_2+\gamma)+(n-2)(t_2+\gamma)+2\gamma$$
$$t_c\geqslant t_1+t_2(n-1)+\gamma(n+1) \qquad (4)$$

Last, the duration $t_p$ of the pump signal shall be calculated. The first pump signal starts with a time lag of $t_1+\gamma$ with respect to the first signal to be coded having a duration $t_c$ and must last at least as long as this signal to be coded in order that the coding of rank $n$ should be carried out correctly.

The duration of the pump signal will be thus:

$$t_p \geqslant t_1+t_2(n-1)+\gamma(n+1)-(t_1+\gamma)$$
$$t_p \geqslant t_2(n-1)+n\gamma \quad (5)$$

Since the amplitude modulated signal to be coded is obtained from a parametric oscillator fed by the same pump signal generator 26 (FIG. 7) as parametric oscillator 44' (FIG. 6), it is obvious in this embodiment that:

$$t_c=t_p=t_1+t_2(n-1)+\gamma(n+1)$$

The build-up time of these parametric oscillators which are identical shall also be equalized, thus:

$$t_1+\gamma=t_2+\gamma=t$$

According to Equation 3:

$$P_p=T+t \quad (6)$$

It may be further stated that:

$$t_c=t_p=\frac{P_p}{2}=\frac{T+t}{2} \quad (7)$$

It may be shown that Equation 7 complies and Equation 4 and 5 if:

$$\frac{T+t}{2} \geq t_1+t_2(n-1)+\gamma(n+1)$$

$$T \geq 2nt-(t-2\gamma)$$

If $t \geqslant 2\gamma$, it may be stated that : $T=2nt$.

The coding duration of $n$ digits is $W_3=n(T+t)$, thus:

$$W_3=nt(2n+1) \quad (8)$$

If for instance, one chooses $n=7$ and $t=5ns(ns=10^{-9}$ second) one has $W_3=525ns$.

The simplifying hypothesis which have led to the development of Equations 7 and 8 have been taken only as a nonlimiting example, and the coding duration obtained may be substantially reduced.

In fact, referring to FIG. 13, it appears that the time $h_7-h_3$ corresponding, on the coder output waveguide 51', (curve E), to the sum of the durations of the first and second parasitic signals derived during the coding of the digit of rank 1 is dead time which can be reduced by having these two signals overlapping one another. It is seen in curves D and E that the useful signal to be coded having a duration $h_3-h_2$ delivered by the coding of the digit of rank 1 is limited by the duration $t_c$ of the signal to be coded. If T is adjusted to be equal to $t_c$, the second parasitic signal having a duration $h_6-h_3$ shall be suppressed and the beginning of the first parasitic signal having a duration $h_7-h_6$ in the coding operation to derive the digit of rank 2 shall coincide with the time $h_3$ which is an admissible limit value. More generally, it may be stated that $T \geqq t_c$, it being understood that the coding duration increases when the loop delay T increases.

With $t_1+\gamma=t_2+\gamma=t$, Equations 4 and 5 will define the minimum values of $t_c$ and $t_p$, namely:

$$t_c=nt+\gamma \quad (4')$$

$$t_p=t(n-1)+\gamma \quad (5')$$

By adjusting $T=t'_c$ Equations 6 and 8 become:

$$P_p=t(n+1)+\gamma \quad (6')$$

and $$W'_3=nt(n+1)+n\gamma \quad (8')$$

By neglecting $n$ in Equation 8' which is very small with respect to $nt(n+1)$, the following equation may be written:

$$\frac{W_3}{W'_3} \cong 2-\frac{1}{n+1}$$

which shows that $W'_3$ ranges between $$\frac{W_3}{1.5} \text{ and } \frac{W_3}{2}$$

and in particular for $n=7$ $$W'_3 \cong \frac{W_3}{1.8}$$

While I have described above the principles of my invention in connection with specific apparatus, it is to be clearly understood that this description is made only by way of example and not as a limitation to the scope of my invention as set forth in the objects thereof and in the accompanying claims.

I claim:

1. An analog to digital converter of the feedback type comprising:
a source of analog signal to be coded;
a signal generator coupled to said source to provide a reference signal, a pump signal and said reference signal modulated by said analog signal, said reference signal and said modulated reference signal having a predetermined phase relationship;
means coupled to said signal generator responsive to said reference signal and said modulated reference signal to produce a locking signal having the phase of the larger amplitude one of said reference signal and said modulated reference signal;
a source of bias signal;
a phase lock parametric oscillator;
means coupling said bias signal and said pump signal to said oscillator to produce oscillations therein;
means coupling said locking signal to said oscillator to lock the oscillations thereof to the phase of said locking signal;
means coupled to said oscillator to extract said locked oscillations therefrom to provide one digit of a code group representing the instantaneous amplitude of said analog signal, the value of said one digit being dependent on the phase of said locked oscillations; and
means coupled to said oscillator and said signal generator responsive to said locked oscillations, said reference signal and said modulated reference signal to produce an output signal proportional to the remainder of said analog signal to be coded after determination of said one digit.

2. An analog to digital converter according to claim 1, wherein said signal generator includes:
a pump signal generator to supply said pump signal;
a carrier wave generator coupled to said signal generator to produce said reference signal having a predetermined amplitude and a predetermined phase relative to the phase of said pump signal;
a phase inverter coupled to said carrier wave generator to invert the phase of said reference signal;
an amplitude modulator coupled to said phase inverter; and
means to couple said analog signal to said modulator to modulate said phase inverted reference signal to provide said modulated reference signal.

3. An analog to digital converter of the feedback type according to claim 1, wherein said signal generator includes:
a pump signal generator to supply said pump signal;
a carrier wave generator coupled to said pump signal generator to provide a reference signal having a predetermined amplitude and a predetermined phase relative to the phase of said pump signal;
a second phase locked parametric oscillator;
means coupling said pump signal from said pump signal generator to said second oscillator to establish oscillation therein;
means coupled to said carrier wave generator to invert the phase of said reference signal and to couple said phase inverted reference signal to said second oscillator as the locking signal therefor;

an amplitude modulator coupled to the output of said second oscillator; and means coupling said analog signal to said modulator to modulate the phase locked oscillations of said second oscillator to provide said modulated reference signal.

4. An analog to digital converter of the feedback type comprising:

a source of analog signal to be coded;

a signal generator coupled to said source to provide a reference signal, a pump signal and said reference signal modulated by said analog signal, said reference signal and said modulated reference signal having a predetermined phase relationship;

means coupled to said signal generator responsive to said reference signal having a first predetermined amplitude and said modulated reference signal to produce a locking signal having the phase of the larger amplitude one of said reference signal and said modulated reference signal;

a source of bias signal;

a phase locked parametric oscillator;

means coupling said bias signal and said pump signal to said oscillator to produce oscillations therein;

means coupling said locking signal to said oscillator to lock the oscillations thereof to the phase of said locking signal;

means coupled to said oscillator to extract said locked oscillation therefrom to provide one digit of a code ground representing the instantaneous amplitude of said analog signal, the value of said one digit being dependent on the phase of said locked oscillations; and means coupled to said oscillator and said signal generator responsive to said locked oscillations, said reference signal having a second predetermined amplitude and said modulated reference signal to produce an output signal proportional to the remainder of said analog signal to be coded after determination of said one digit.

5. An analog to digital converter of the feedback type comprising:

a source of analog signal to be coded;

a signal generator coupled to said source to provide a reference signal, a pump signal and said reference signal modulated by said analog signal, said reference signal and said modulated reference signal having a predetermined phase relationship;

means coupled to said generator responsive to said reference signal and said modulated reference signal to produce a locking signal having the phase of the larger amplitude one of said reference signal and said modulated reference signal;

a source of bias signal;

a phase locked parametric oscillator;

means coupling said bias signal and said pump signal to said oscillator to produce oscillations therein;

means coupling said locking signal to said oscillator to lock the oscillations thereof to the phase of said locking signal;

means coupled to said oscillator to extract said locked oscillations therefrom to provide one digit of a code group representing the instantaneous amplitude of said analog signal, the value of said one digit being dependent on the phase of said locked oscillations;

means coupled to said oscillator and said signal generator responsive to said locked oscillations, said reference signal and said modulated reference signal to produce an output signal proportional to the remainder of said analog signal to be coded after determination of said one digit; and means coupled to said output signal producing means to enable the production of the other digits of said binary code group.

6. An analog to digital converter of the feedback type comprising:

a source of analog signal to be coded;

a signal generator coupled to said source to provide a reference signal, a pump signal and said reference signal modulated by said analog signal, said reference signal and said modulated reference signal having a predetermined phase relationship;

means coupled to said signal generator responsive to said reference signal having a first predetermined amplitude and said modulated reference signal to produce a locking signal having the phase of the larger amplitude one of said reference signal and said modulated reference signal;

a source of bias signal;

a phase locking parametric oscillator;

means coupling said bas signal and said pump signal to said oscillator to produce oscillations therein;

means coupling said locking signal to said oscillator to lock the oscillations thereof to the phase of said locking signal;

means coupled to said oscillator to extract said locked oscillations therefrom to provide one digit of a code group representing the instantaneous amplitude of said analog signal, the value of said one digit being dependent on the phase of said locked oscillations;

means coupled to said oscillator and said signal generator responsive to said locked oscillations, said reference signal having a second predetermined amplitude and said modulated reference signal to produce an output signal proportional to the remainder of said analog signal to be coded after determination of said one digit; and means coupled to said output signal producing means to enable the production of the other digits of said binary code group.

7. An analog to digital converter of the feedback type comprising:

a source of analog signal to be coded;

a signal generator coupled to said source to provide a reference signal, a pump signal and said reference signal modulated by said analog signal, said reference signal and said modulated reference signal having an opposed phase relationship;

a mixer coupled to said signal generator responsive to said reference signal having a first predetermined amplitude and said modulated reference signal to produce a locking signal having the phase of the larger amplitude one of said reference signal and said modulated reference signal;

a source of bias signal;

a phase locked parametric oscillator;

means coupling said bias signal and said pump signal to said oscillator to produce oscillations therein;

means coupling said locking signal to said oscillator to lock the oscillations thereof to the phase of said locking signal;

means coupled to said oscillator to extract said locked oscillations therefrom to provide one digit of a code group representing the instantaneous amplitude of said analog signal, the value of said one digit being dependent on the phase of said locked oscillations; and a second mixer coupled to said oscillator and said signal generator responsive to an inverted phase version of said locked oscillations having a second predetermined amplitude, said reference signal having a third predetermined amplitude and said modulated reference signal to produce an output signal proportional to the remainder of said analog signal to be coded after determination of said one digit.

8. An analog to digital converter of the feedback type comprising:

a source of analog signal to be coded;

a signal generator coupled to said source to provide a reference signal, a pump signal and said reference signal modulated by said analog signal, said reference signal and said modulated reference signal having an opposed phase relationship;

a mixer coupled to said signal generator responsive to said reference signal having a first predetermined amplitude and said modulated reference signal to produce a locking signal having the phase of the larger amplitude one of said reference signal and said modulated reference signal;

a source of bias signal;

a phase locked parametric oscillator;

means coupling said bias signal and said pump signal to said oscillator to produce oscillations therein;

means coupling said locking signal to said oscillator to lock the oscillations thereof to the phase of said locking signal;

means coupled to said oscillator to extract said locked oscillations therefrom to provide one digit of a code group representing the instantaneous amplitude of said analog signal, the value of said one digit being dependent on the phase of said locked oscillations;

a second mixer coupled to said oscillator and said signal generator responsive to an inverted phase version of said locked oscillations having a second predetermined amplitude, said reference signal having a third predetermined amplitude and said modulated reference signal to produce an output signal proportional to the remainder of said analog signal to be coded after determination of said one digit; and means coupled to said second mixer to enable the production of other digits of said code group.

9. An analog to digital converter of the feedback type according to claim 8, wherein said signal generator includes:

a pump signal generator;

a carrier wave generator coupled to said signal generator to produce said reference signal having an amplitude greater than said first predetermined amplitude and a predetermined phase relative to the phase of said pump signal;

means coupled to said wave generator to invert the phase of said reference signal;

an amplitude modulator coupled to said phase inverting means; and means coupling said analog signal to said modulator to modulate said phase inverted reference signal to provide said modulated reference signal.

10. An analog to digital converter of the feedback type according to claim 8, wherein said signal generator includes:

a pump signal generator to supply said pump signal;

a carrier wave generator coupled to said pump signal generator to produce a reference signal having an amplitude greater than said first predetermined amplitude and a predetermined phase relative to the phase of said pump signal;

a second phase locked parametric oscillator;

means to couple said pump signal from said pump signal generator to said second oscillator to produce oscillations therein;

means coupled to said carrier wave generator to invert the phase of said reference signal and to couple said phase inverted reference signal to said second oscillator as a locking signal therefor;

an amplitude modulator coupled to the output of said second oscillator; and means coupling said analog signal to said modulator to modulate the phase locked oscillations of said second oscillator to provide said modulated reference signal.

11. An analog to digital converter of the feedback type comprising:

a source of analog signal to be coded;

a signal generator coupled to said source to provide a reference signal, a pump signal and said reference signal modulated by said analog signal, said reference signal and said modulated reference signal having a predetermined phase relationship;

a first waveguide carrying said reference signal;

a second waveguide carrying said modulated reference signal;

a third waveguide carrying said pump signal;

a first directional coupler extracting a predetermined quantity of said reference signal from said first waveguide;

a second directional coupler coupled to said second waveguide to extract a predetermined quantity of said modulated reference signal;

a third directional coupler coupled to said first and second directional couplers to mix said modulated reference signal and said reference signal to provide a locking signal having the phase of the larger amplitude one of said reference signal and said modulated reference signal;

a source of bias signal;

a phase locked parametric oscillator coupled to said source of bias signal;

a fourth directional coupler coupled to said third waveguide to couple said pump signal to said oscillator to cause in conjunction with said bias signal oscillations therein;

a circulator coupled to said third directional coupler and said parametric oscillator to couple said locking signal to said oscillator to lock the oscillations thereof to the phase of said locking signal and to extract said locked oscillations therefrom;

waveguide means coupled to said circulator to remove said locked oscillations therefrom;

a fifth directional coupler coupled to said waveguide means to extract one digit of a code group representing the instantaneous amplitude of said analog signal, the value of said one digit being dependent on the phase of said locked oscillations;

a sixth directional coupler coupled to said waveguide means and said second waveguide to mix a phase inverted version of said locked oscillation with said modulated reference signal;

a seventh directional coupler to couple a predetermined fraction of said reference signal from said first waveguide;

an attenuating element coupled to the output of said seventh directional coupler to reduce the amplitude of said reference signal to a predetermined value; and an eighth directional coupler coupled to said attenuating element and said second waveguide to mix said reference signal at the output of said attenuating element and the mixed phase inverted phase locked oscillations and said modulated reference signal to provide an output signal proportional to the remainder of said analog signal to be coded after determination of said one digit.

12. An analog to digital converter of the feedback type comprising:

a source of analog signal to be coded;

a signal generator coupled to said source to provide a reference signal, a pump signal and said reference signal modulated by said analog signal, said reference signal and said modulated reference signal having a predetermined phase relationship;

a first waveguide carrying said reference signal;

a second waveguide carrying said modulated reference signal;

a third waveguide carrying said pump signal;

a first directional coupler coupled to said first waveguide to extract a given fraction of said reference signal therefrom;

a second directional coupler coupled to said second waveguide to extract a given fraction of said modulated reference signal therefrom;

a third directional coupler coupled to said first and second directional couplers to mix said reference signal and said modulated reference signal to provide a locking signal having the phase of the larger amplitude one of said reference signal and said modulated reference signal;

a source of bias signal;

a phase locked parametric oscillator coupled to said source of bias signal;

a fourth directional coupler coupled to said third waveguide to supply said pump signal to said oscillator to produce oscillations therein in conjunction with said bias signal;

a circulator coupled to said third directional coupler to couple said locking signal to said oscillator to lock the oscillations thereof to the phase of said locking signal and to extract said locked oscillations from said oscillator;

a fifth waveguide coupled to said circulator to couple said locked oscillations therefrom;

a phase shift element disposed in said fifth waveguide to invert the phase of said locked oscillations;

a fifth directional coupler coupled to said fourth waveguide and said second waveguide to mix said modulated reference signal and said phase inverted locked oscillations;

a sixth directional coupler coupled to said first waveguide to extract a given portion of said reference signal therefrom;

a seventh directional coupler coupled to said sixth directional coupler and said fifth directional coupler to mix said reference signal with the mixed modulated reference signal and inverted locked oscillations to provide an output signal proportional to the remainder of said analog signal to be coded after determination of one digit of a code group representing an instantaneous amplitude of said analog signal, the value of said one digit being dependent on the phase of said locked oscillations;

an eighth directional coupler coupled to said fourth waveguide to extract said locked oscillations therefrom to provide an output for said one digit;

a second phase locked parametric oscillator coupled to said signal generator responsive to a delayed version of said pump signal to produce oscillations therein;

a second circulator coupled to said eighth directional coupler to couple said one digit to said second oscillator as a locking signal therefor and extracting from said second oscillator locked oscillations indicative of the value of said locked oscillations of said first oscillator; and means coupled to said second circulator to extract said resultant one digit signal.

13. An analog to digital converter of the feedback type comprising:

a source of analog signal to be coded;

a signal generator coupled to said source to provide a reference signal, a pump signal and said reference signal modulated by said analog signal, said reference signal and said modulated reference signal having a predetermined phase relationship;

a plurality of stages coupled in tandem to said signal generator;

each of said stages including;

means to reduce the amplitude of said reference signal a predetermined amount;

means coupled to said signal generator responsive to said reduced amplitude reference signal and said modulated reference signal to produce a locking signal having the phase of the larger amplitude one of said reference signal and said modulated reference signal;

a phase locked parametric oscillator responsive to said pump signal to produce oscillations therein;

means coupling said locking signal to said oscillator to lock the oscillations thereof to the phase of said locking signal;

means coupled to said oscillator to extract said locked oscillations therefrom to provide one digit of a code group representing the amplitude of said analog signal, the value of said one digit being dependent on the phase of said locked oscillations; and means coupled to said oscillator and said signal generator responsive to said locked oscillations, said reference signal and said modulated reference signal to produce an output signal proportional to the remainder of said analog signal to be coded after determination of the digit of the associated stage;

means coupled to each of said stages to extract the digits produced by said stages; and means disposed between each of said stages to delay the application of said pump signal to the next lower weight stage.

14. An analog to digital converter of the feedback type comprising:

a source of analog signal to be coded;

a signal generator coupled to said source to provide a reference signal, a pump signal and said reference signal modulated by said analog signal, said reference signal and said modulated reference signal having a predetermined phase relationship;

means coupled to said signal generator responsive to said reference signal and said modulated reference signal to produce a locking signal having the phase of the larger amplitude one of said reference signal and said modulated reference signal;

a phase locked parametric oscillator coupled to said signal generator responsive to said pump signal to produce oscillations therein;

means coupling said locking signal to said oscillator to lock the oscillations thereof to the phase of said locking signal;

means coupled to said oscillator to extract said locked oscillations therefrom to provide a digit output for each of the digits of a code group representing the instantaneous amplitude of said analog signal, the value of said digits being dependent on the phase of said locked oscillations;

means coupled to said oscillator and said signal generator responsive to said locked oscillations, said reference signal and said moulated reference signal to produce an output signal proportional to the remainder of said analog signal to be coded after determination of each of said digits; and means coupling said output signal to said locking signal producing means.

15. A binary coder stage of the feedback type utilizing a parametric phase-locked oscillator as a decision element comprising:

means for generating a pump signal;

first means coupled to said generating means for obtaining from said pump signal a reference signal having an amplitude 2R and a frequency equal to one half the frequency of said pump signal;

second means coupled to said first means for phase inversion of said reference signal and for amplitude modulation of the phase inverted reference signal by an analog signal input having an amplitude C inferior or equal to 2R, the phase of said modulated reference signal being 0° and the phase of said reference signal being 180°;

first mixing means for mixing said reference signal attenuated to an amplitude R and said modulated reference signal to deliver an output signal whose phase is 0° or 180° depending on which of said reference signal and said modulated reference signal have the higher amplitude;

third means coupled to said first mixing means and said generating means for coupling said output signal to said oscillator as the phase locking signal therefor and for applying said pump signal to said oscillator to start oscillations therein after a build-up time $t$ with a phase locked to the phase of said output signal, that phase being 0° if $C>R$ and 180° if $C<R$;

fourth means for inverting the phase of the output signal of said oscillator and for attenuating the resulting signal to an amplitude equal to $$\frac{R}{2}$$

and second mixing means coupled to said first means, said second means and said fourth means for mixing together said signal of amplitude $$\frac{R}{2}$$

having a phase of 0° if $C>R$ or 180° if $C<R$, said reference signal attenuated to an amplitude of $$\frac{R}{2}$$

having a phase of 180°, and said modulated reference signal having an amplitude C and a phase of 0° to provide an output signal from said second mixing circuit having an amplitude $C-R$ and a phase of 0° if $C>R$ and an amplitude C and a phase of 0° if $C<R$.

16. The combination of $n$ cascade connected binary coder stages according to claim 15, wherein each digit stage receives from the next most significant stage a signal input of phase 0° having an amplitude $C'=C-R$ or $C'=C$ comprising:

means coupled to said first means for attenuating 6 db the amplitude of said reference signal between each successive stages;

means coupled to said generating means for delaying the pump signal for a time $t$ between a given stage and the next less significant stage;

said generating means applying said pump signal during a time $nt$ so that the most significant digit's phase locked parametric oscillator still oscillates at the time when the least significant digit's phase locked parametric oscillator enters into oscillation; and means coupled to each of said stages to obtain the output signals of the $n$ phase locked parametric oscillators in a total encoding time of $n(nt+t_e)$, where $t_e$ is equal to the extinction time of the oscillations of each phase locked parametric oscillator.

17. The combination of $n$ cascade connected binary stages according to claim 15, wherein:

said generating means couples said pump signal to said phase locked parametric oscillator of each coder stage for a duration of $nt$;

means for delaying said pump signal for a time $t$ between a given stage and the next less significant stage;

means for separating each digit output circuit from the corresponding phase lock parametric oscillator including in each stage a second phase locked parametric oscillator;

means coupling said pump signal to said second oscillator for a duration $t$; and means for delaying said pump signal coupled to said second oscillator for a time $t$ between a given stage and the next less significant stage so that each of said second oscillators remains in oscillation for a time interval of $t+t_e$ and the complete encoding time is $n(t+t_e)$, where $t_e$ is equal to the extinction time of each of said second oscillators.

18. A binary feedback encoder of the single stage type according to claim 15, comprising:

a feedback delay loop having a gain of 6 db and a time delay of T connecting the output of said second mixing means to the signal input of said first mixing means;

said generating means producing pump signals having a duration of $$\frac{T+t_a}{2}$$

where $t_a$ is the sum of the build-up time $t$ of oscillation in said oscillator and of a guard time $\gamma$ with $t_a \geqq 2\gamma$; and means for delaying the application of the first pump signal for a time $t_a$ with respect to the input signal having duration $$\frac{T+t_a}{2}$$

so that by taking $T=2nt_a$ the input signal for the $n^{th}$ coding operation coincides for more than a time $\gamma$ with the $n^{th}$ pump signal thereby assuring a correct locking of said oscillator and the complete encoding time is $nt_a(2n+1)$.

References Cited by the Examiner

UNITED STATES PATENTS

| | | | |
|---|---|---|---|
| 2,928,053 | 3/60 | Keyasu et al. | 340—347 |
| 3,000,006 | 9/61 | Williams | 340—347 |
| 3,014,210 | 12/61 | Beaumont | 340—347 |
| 3,085,205 | 4/63 | Sante | 333—83 X |

MALCOLM A. MORRISON, *Primary Examiner.*